US 9,456,510 B2

(12) United States Patent
Hattori et al.

(10) Patent No.: US 9,456,510 B2
(45) Date of Patent: Sep. 27, 2016

(54) ELECTRICAL JUNCTION BOX

(71) Applicant: Sumitomo Wiring Systems, Ltd., Yokkaichi, Mie (JP)

(72) Inventors: Yuuichi Hattori, Yokkaichi (JP); Akihiro Oda, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 330 days.

(21) Appl. No.: 13/890,441

(22) Filed: May 9, 2013

(65) Prior Publication Data

US 2013/0343018 A1 Dec. 26, 2013

(30) Foreign Application Priority Data

Jun. 20, 2012 (JP) ................................. 2012-138889

(51) Int. Cl.
*H05K 5/00* (2006.01)
(52) U.S. Cl.
CPC .......... *H05K 5/0026* (2013.01); *H05K 5/0065* (2013.01)
(58) Field of Classification Search
CPC .. H05K 5/0026; H05K 5/0065; H01R 12/52; H01R 13/6271; H01R 13/631
See application file for complete search history.

(56) References Cited

U.S. PATENT DOCUMENTS

| 6,929,489 B2 * | 8/2005 | Asao | H01R 13/4538 |
| | | | 439/140 |
| 7,267,556 B2 * | 9/2007 | Oka | H01R 9/2466 |
| | | | 439/75 |
| 7,507,094 B2 | 3/2009 | Kubota et al. | |

FOREIGN PATENT DOCUMENTS

JP 2010-200503 9/2010

* cited by examiner

*Primary Examiner* — Xanthia C Cunningham
(74) *Attorney, Agent, or Firm* — Gerald E. Hespos; Michael J. Porco; Matthew T. Hespos

(57) ABSTRACT

An electrical junction box (10) has a main body-side connector (40) provided in a box body (12). An attachment body-side connector (76) is provided in an attachment body (14) that is separate from the box body (12) and is connected to the main body-side connector (40) by rotating the attachment body (14) on a rotating portion (72) provided at an end of the attachment body (14). The rotating portion (72) is supported by a support (30) on a side of the box body (12) opposite to the main body-side connector (40), and a positioning portion directly positions the main body-side connector (40) with respect to the upper case (20).

5 Claims, 5 Drawing Sheets

ELECTRICAL JUNCTION BOX

BACKGROUND

1. Field of the Invention

The invention relates to an electrical junction box installed in an automobile or the like, and particularly relates to an electrical junction box in which a box body and an attachment body that is separate from the box body are connected to each other via connectors by mounting the attachment body to the box body by a rotating operation.

2. Description of the Related Art

U.S. Pat. No. 7,507,094 discloses an electrical junction box installed in an automobile. The electrical junction box of U.S. Pat. No. 7,507,094 has as an electronic control unit (ECU) provided as an attachment body that is separate from a box body of the electrical junction box, so that the attachment body can be mounted removably to the box body. The structurally separate electronic control unit has the advantage of being easily replaced or changed, and so on.

The electrical junction box disclosed in U.S. Pat. No. 7,507,094 has a rotating portion provided at an end of the attachment body and supported by a support in a case of the box body so that the attachment body is mounted rotatably to the box body. Rotating the attachment body enables a main body connector in the box body to connect with an attachment body connector in the attachment body.

The rotating portion of the attachment body is supported by the supporting portion of the case of the box body, and thus the attachment body is positioned with respect to the case at the supporting portion. Meanwhile, the main body-side connector in the box body is on the side of the case that is opposite to the supporting portion and away from the supporting portion. For this reason, it was difficult to align the attachment body connector of the attachment body with the main body connector.

The inventors of the present invention have proposed an electrical junction box in JP 2010-200503A, in which a guide pin is provided in the vicinity of the attachment body connector of an attaching portion, and a guide groove that guides the guide pin in a connector connecting direction is provided in the vicinity of the main body connector of the case of the box body. With this configuration, the attachment body can be positioned with respect to the case near the connectors by inserting the guide pin into the guide groove, and the attachment body connector and the main body connector can be aligned with each other more accurately. However, special processing also is required for the guide pin on the attaching portion side of the electrical junction box disclosed in JP 2010-200503A, and the guide groove on the box body leads to an increase in the size of the box body.

The invention was made in view of the above-described circumstances, and it is an object thereof to provide an electrical junction box in which a main body-side connector provided in a box body and an attachment body-side connector provided in an attachment body are connected to each other by rotating the attachment body with respect to the box body, and so that the main body-side connector and the attachment body-side connector can be connected to each other more easily and accurately without requiring special processing on the attachment body side.

To achieve the object, the inventors conducted research on electrical junction boxes conforming to conventional structures disclosed in U.S. Pat. No. 7,507,094, and the like. The inventors found that improper positioning of the main body-side connector in the box body of the conventional electrical junction box is one of major causes of difficulty when connecting the main body-side connector and the attachment body-side connector to each other. More particularly, the accuracy of the positioning of the attachment body on the case of the box body affects the accuracy of the positioning of the attachment body-side connector with respect to the main body-side connector. The invention was made based on these new findings.

SUMMARY OF THE INVENTION

The invention relates to an electrical junction box with a circuit board accommodated in a case that forms a box body. A main body-side connector is provided on the circuit board and protrudes above an attachment surface of the case through an opening hole that penetrates the case. An attachment body-side connector is provided in an attachment body that is separate from the box body and is connected to the main body-side connector by rotating the attachment body on a rotating portion provided at an end of the attachment body. The rotating portion is supported by a support provided on a side of the case that is opposite to the main body-side connector. A positioning portion directly positions the main body-side connector with respect to the case.

"Directly" as used herein means that the main body-side connector is positioned on the case without any other member interposed therebetween. Thus, the main body-side connector can be positioned accurately with respect to the case, and the attachment body that is mounted to the case can be aligned more accurately with the main body-side connector. Consequently, the attachment body-side connector provided in the attachment body can be connected more easily and reliably to the main body-side connector.

The accuracy of connection between the connectors can be improved without changing the external shape of the box body or performing special processing on the attachment body side. Known structures can be adopted as the positioning portion, such as projection-recess fitting by means of a projection and a recess provided in the main body-side connector and the case or engagement by insertion of a projection in one of the main body-side connector and the case into a through hole provided in the other.

The main body-side connector preferably has an elongate shape extending parallel to the axis of rotation of the attachment body, and the positioning portion is provided at both longitudinal ends of the main body-side connector. Thus, the main body-side connector can be positioned stably and more accurately by positioning the elongate main body-side connector with respect to the case at the two longitudinal ends.

A projection preferably is formed in one of the case and the main body-side connector, a recess is formed in the other for receiving the projection. The projection and the recess define the positioning portion. Thus, the main body-side connector can be positioned on the case by a structurally simple, easy to assemble projection-recess fitting.

The main body-side connector is bolted to the circuit board, and the projection or the recess is coaxial with a bolt hole in the main body-side connector. Thus, the positioning portion is formed using a region of the main body-side connector that has the bolt hole, and thus the positioning portion can be formed without increasing the size of the main body-side connector.

The positioning portion enables the main body-side connector to be positioned directly with respect to the case of the box body without any other member interposed therebetween. Thus, the main body-side connector can be positioned accurately with respect to the case, so that the attachment body that is mounted to the case can be aligned more accurately with the main body-side connector. Consequently, the attachment body-side connector in the attachment body and the main body-side connector can be connected to each other more easily and reliably.

DETAILED DESCRIPTION OF THE PREFERRED EMBODIMENTS

Figure 1:
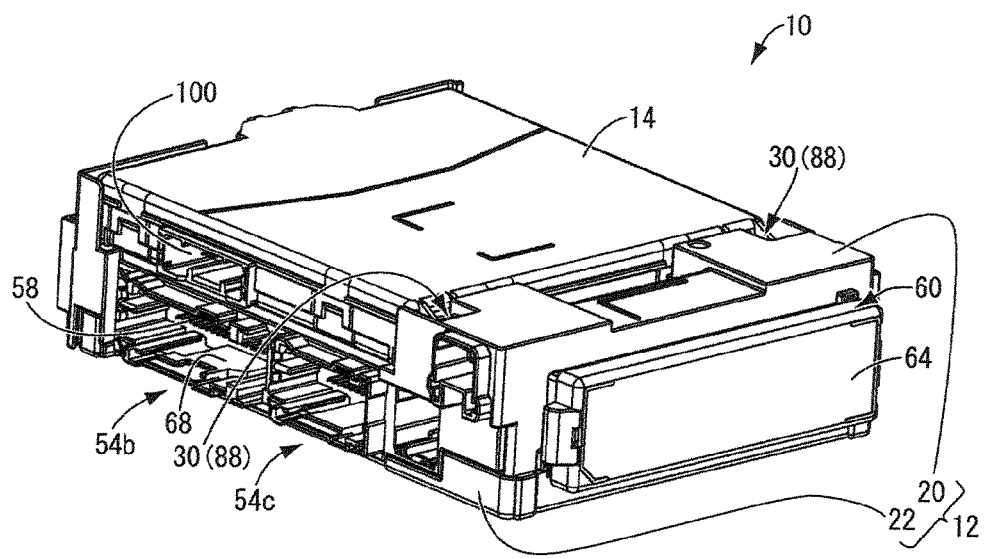
FIG. 1 is a perspective view showing an electrical junction box in accordance with an embodiment of the invention.

An electrical junction box in accordance with an embodiment of the invention is identified by the number 10 in FIGS. 1 to 9. As shown in FIG. 1, the electrical junction box 10 includes a box body 12 and an attachment body 14 that is separate from the box body 12. The box body 12 has upper and lower cases 20 and 22, and a circuit board 18 is accommodated between the cases 20 and 22. The terms "upper" and "lower" as used herein refer to the orientation in FIG. 1.

Figure 2:
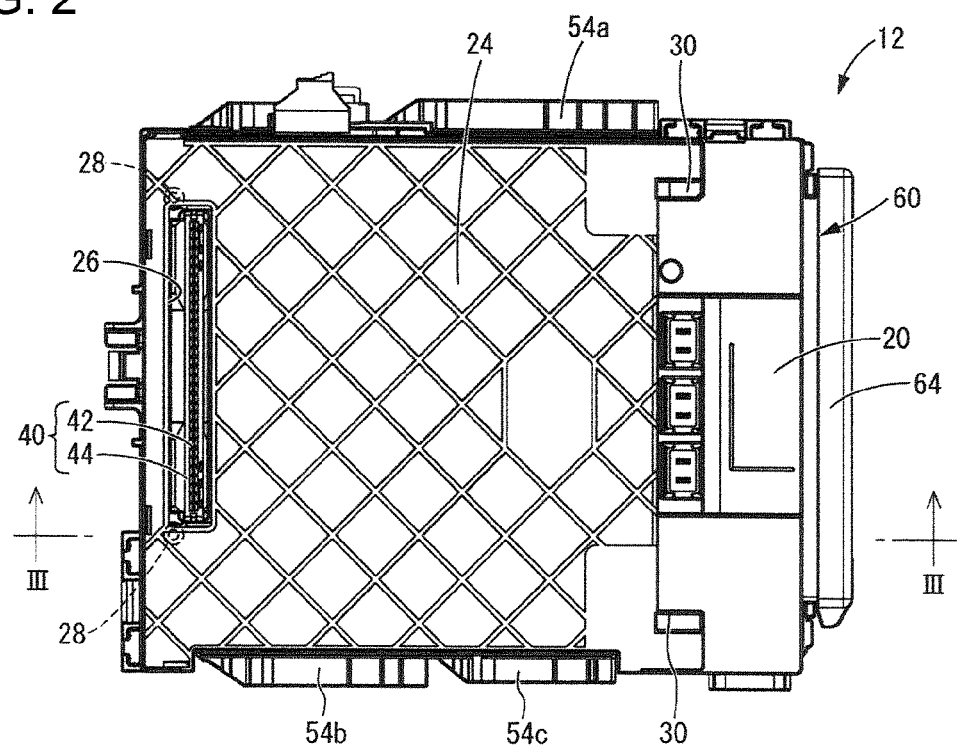
FIG. 2 is a plan view of a box body of the electrical junction box.
Figure 4:
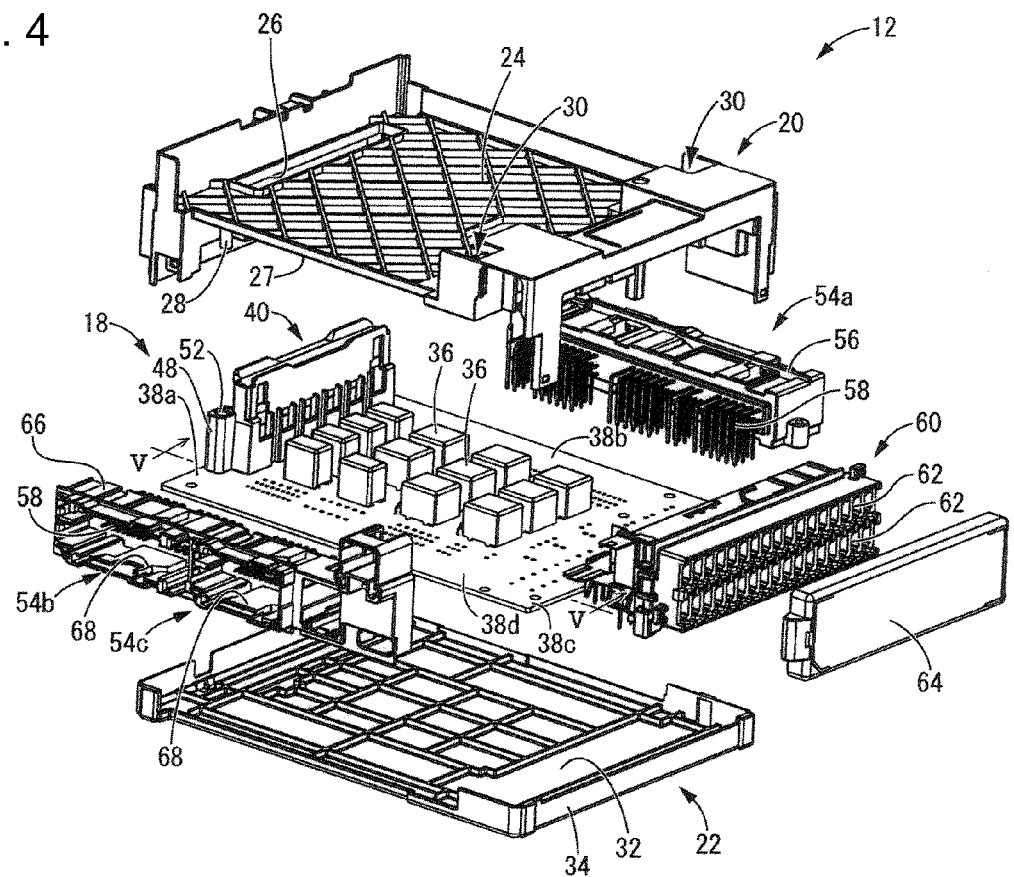
FIG. 4 is an exploded perspective view of the box body of the electrical junction box.

The upper case 20 is molded unitarily of a synthetic resin and has a substantially rectangular box shape that opens down. As shown in FIGS. 2 and 4, an attachment surface 24 is formed at an upper face of the upper case 20, and an opening hole 26 penetrates the attachment surface 24 at one end of the upper case 20. The upper case 20 has a lower face 27 and two cylindrical projections 28 project down from lower face 27 at opposite longitudinal ends of the opening hole 26. Two supports 30 are provided at the end portion of the attachment surface 24 opposite the opening hole 26.

The lower case 22 is molded unitarily from a synthetic resin and has a substantially rectangular box shape that opens up, as shown in FIG. 4. The lower case 22 has a substantially rectangular plate-shaped bottom wall 32 and a peripheral wall 34 extending up from an outer periphery of the bottom wall 32.

Figure 5:
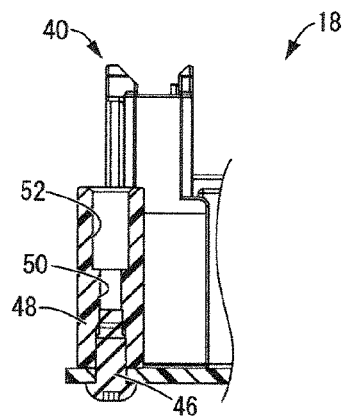
FIG. 5 is a cross section along line V-V in FIG. 4.

The circuit board 18 has a rectangular plate shape, as shown in FIG. 4. Various electrical components, such as relays 36, are provided appropriately on a central portion of the circuit board 18. An elongate main body-side connector 40 from extends up from an outer peripheral portion 38a at one end of the circuit board 18. As shown in FIG. 2, the main body-side connector 40 includes a bar-like male terminal 42 for electrical connection to the attachment body 14 and a rectangular tubular housing 44 formed from a synthetic resin surrounds the male terminal 42. The main body-side connector 40 is fixed to the circuit board 18 by bolts 46, as shown in FIGS. 4 and 5. More particularly, bolt fixing portions 48 are formed at both longitudinal ends of the main body-side connector 40 and have bolt holes 50. The bolts 46 are screwed from a lower face of the circuit board 18 into the bolt holes 50 of the bolt fixing portions 48 in the main body-side connector 40. Upper ends of the bolt holes 50 are coaxial with the respective projections 28 on the lower face 27 of the upper case 20, and define recesses 52 with openings slightly larger than the projections 28 so that projection-recess fitting with the projections 28 can be achieved.

A lateral connection type connector 54a is disposed at an outer peripheral portion 38b along a side that is perpendicular to the outer peripheral portion 38a, as shown in FIG. 4. The lateral connection type connector 54a has a connector accommodating member 56 that is formed of a synthetic resin and opens to a lateral side of the electrical junction box 10. L-shaped board terminals 58 are inserted into the connector accommodating member 56 and have ends bent toward the circuit board 18. These ends of the board terminals 58 are soldered to a printed circuit on the circuit board 18.

A fuse module 60 is at an outer peripheral portion 38c of the circuit board 18 that is opposite the outer peripheral portion 38a. The fuse module 60 has fuse attachment portions 62 formed in two tiers one above the other. Each tier has the fuse attachment portions 62 arranged side by side in a row extending in the longitudinal direction of the fuse module 60. A cover 64 is mounted to the fuse module 60 and covers the openings of the fuse attachment portions 62 to protect the insides of the fuse attachment portions 62.

A side wall 66 is disposed at an outer peripheral portion 38d of the circuit board 18 opposite the outer peripheral portion 38b. The side wall 66 is molded unitarily of a synthetic resin and has an elongated shape. Two rectangular connector accommodating portions 68 are formed in the side wall 66 and open toward an outer side of the circuit board 18 at positions adjacent to each other in the longitudinal direction. L-shaped board terminals 58 are inserted into the connector accommodating portions 68 to form lateral connection type connectors 54b and 54c.

Figure 3:
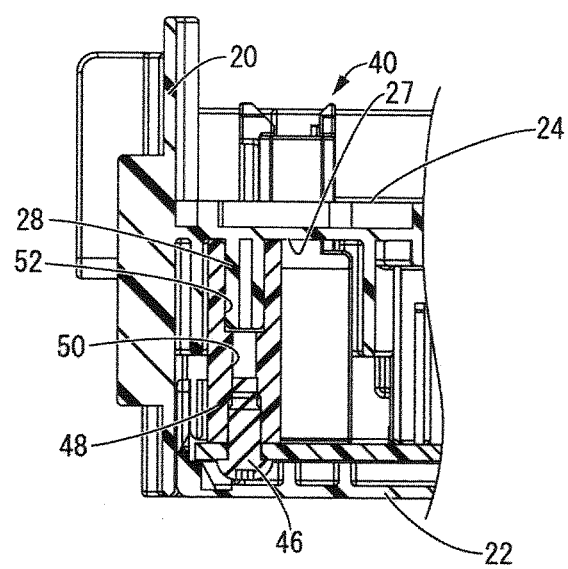
FIG. 3 is a cross section along line III-III in FIG. 2.

The circuit board 18 is accommodated between the upper case 20 and the lower case 22 of the box body 12. The main body-side connector 40 on the circuit board 18 protrudes through the opening hole 26 in the attachment surface 24, as shown in FIG. 2. As shown in FIG. 3, the projections 28 on the lower face 27 of the upper case 20 are engaged by projection-recess fitting with the respective recesses 52 formed in the upper portions of the bolt holes 50 of the main body-side connector 40 coaxially with the respective projections 28. Thus the main body-side connector 40 is positioned directly with respect to the upper case 20 so that a positioning portion is configured by projection-recess fitting between the projections 28 and the respective recesses 52.

The attachment body 14 is an electronic control unit of a vehicle, such as an ECU, and is attached and electrically connected to the box body 12. Thus, the attachment body 14 receives power supply from the box body 12 and controls electronic components, such as relays, in the box body 12. The electrical junction box 10 referred to herein may also be a junction block, a fuse box, a relay box, or the like.

Figure 6:
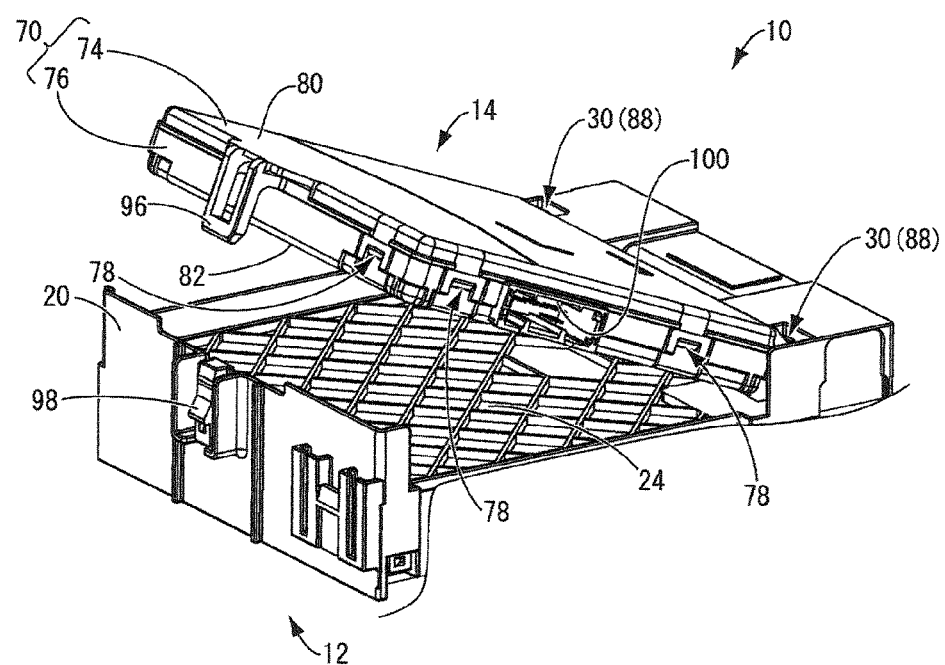
FIG. 6 is a perspective view showing a state in which assembly of the electrical junction box shown in FIG. 1 is in progress.
Figure 7:
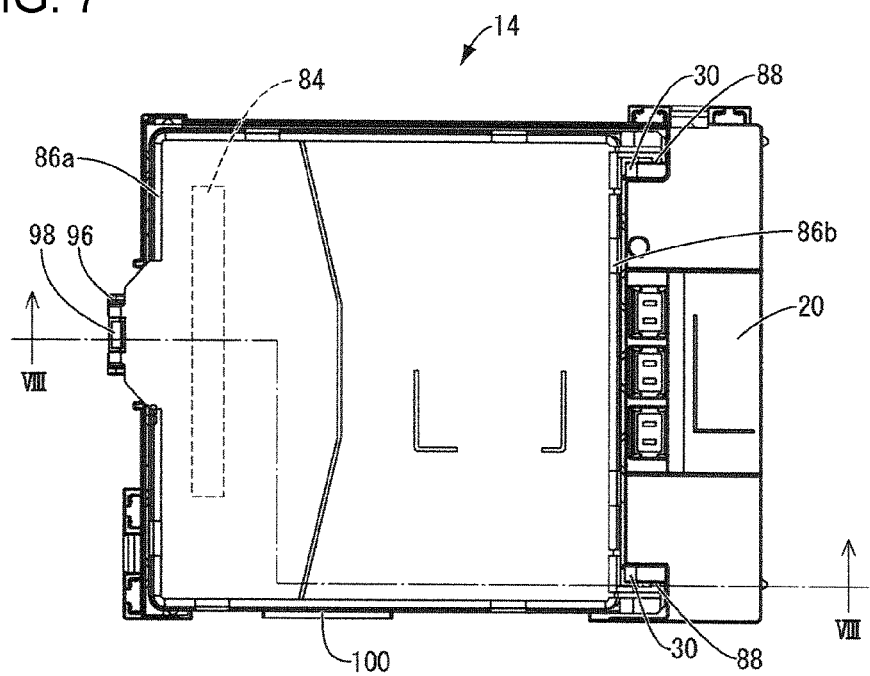
FIG. 7 is a plan view of the electrical junction box shown in FIG. 1.
Figure 8:
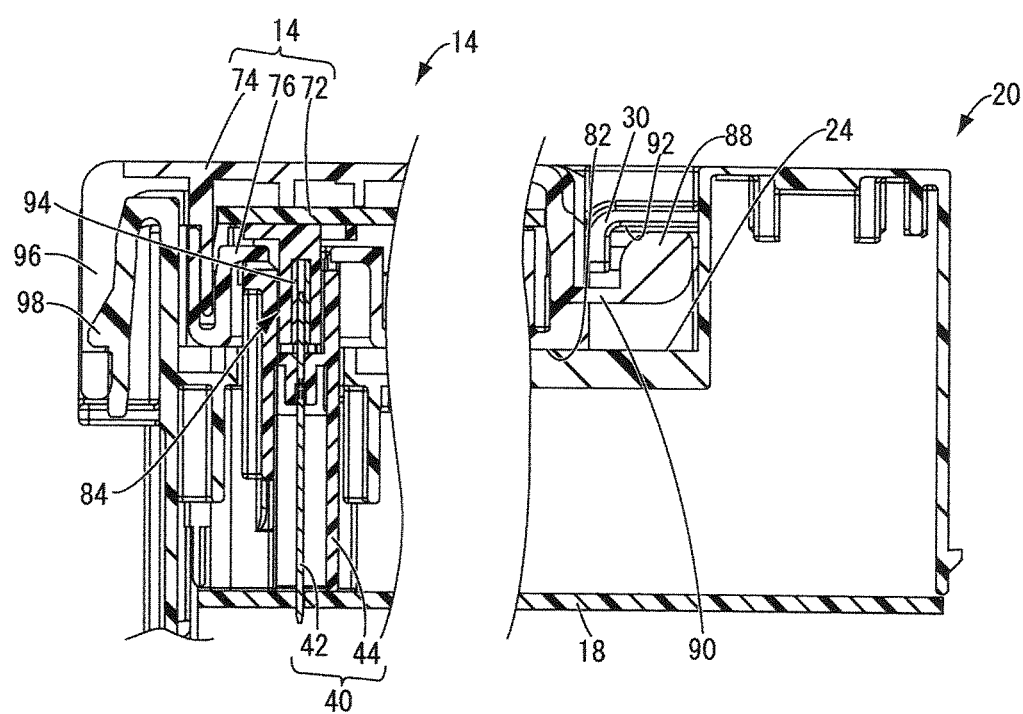
FIG. 8 is a cross section along line VIII-VIII in FIG. 7.

As shown in FIGS. 6 and 7, the attachment body 14 has a circuit board 72 accommodated inside a housing 70 formed of a synthetic resin. The housing 70 is a hollow box structure formed by upper and lower cases 74 and 76 having substantially rectangular open box-like shapes. The upper and lower cases 74 and 76 are placed one on top of the other so that their open sides are opposed and are fastened to each other by locking at locks 78. Upper and lower faces 80 and 82 of the housing 70 have rectangular shapes that are smaller than the attachment surface 24 of the box body 12, and the lower face 82 of the housing 70 is superposed on the attachment surface 24 when the attachment body 14 is attached to the box body 12.

The circuit board 72 accommodated in the housing 70 has an attachment body-side connector 84 to be connected to the main body-side connector 40 on the circuit board of the box body 12. The attachment body-side connector 84 extends along one side edge portion 86a (on the left side in FIG. 7) of the housing 70. Additionally, the attachment body-side connector 84 faces the main body-side connector 40 and extends toward the main body-side connector 40 when the lower face 82 of the housing 70 faces the attachment surface 24 of the box body 12 and is parallel thereto (see FIG. 8). Two rotating portions 88 protrude out from respective ends of a side edge portion 86b of the housing 70 (the right-hand side in FIG. 7) that is opposite the side edge portion 86a. The rotating portions 88 are coupled integrally to the side edge portion 86b via respective supporting legs 90 extending away from the attachment body-side connector 84. Moreover, the rotating portions 88 have substantially elliptical cross sections and extend a predetermined distance in the longitudinal direction (vertical direction in FIG. 7) of the attachment body-side connector 84.

The box body 12 and the attachment body 14 are assembled using a known method, such as that disclosed in JP 2010-200503A. More particularly, as shown in FIG. 6, the attachment body 14 first is oriented so that the lower face 82 thereof faces the attachment surface 24 of the box body 12, and in this state, the rotating portions 88 are inserted into respective accommodation cavities 92 in the supports 30 of the upper case 20 (see FIG. 8). Thus, hinges are formed by the rotating portions 88 and the supports 30. Here, the main body-side connector 40 and the attachment body-side connector 84 extend so that the longitudinal directions of the connectors are parallel to the direction (vertical direction in FIG. 7) and the rotating portions 88 extend in the longitudinal direction to define the axis of rotation of the attachment body 14. The attachment body 14 then is rotated about the rotating portions 88 so that the lower face 82 of the attachment body 14 approaches the attachment surface 24 of the upper case 20. Moreover, the rotation about the rotating portions 88 is accompanied by a sliding operation in which the rotating portions 88 move up in FIG. 8 while being gradually inserted farther into the accommodation cavities 92 to achieve a smooth rotating operation of the attachment body 14.

In this manner, the rotating portions 88 at an end of the attachment body 14 are rotated while being supported by the supports 30 on the side of the upper case 20 opposite the main body-side connector 40, and as a result, the attachment body 14 is superposed on the attachment surface 24. Consequently, the attachment body-side connector 84 on the attachment body 14 is inserted into the main body-side connector 40 protruding from the attachment surface 24, and the male terminal 42 disposed in the main body-side connector 40 is connected to a female terminal 94 disposed in the attachment body-side connector 84. Thus, the circuit board 18 of the box body 12 and the circuit board 72 of the attachment body 14 are connected electrically to each other. A lock arm 96 is provided on an end edge of the attachment body 14 opposite the rotating portions 88 and engages a lock 98 in the upper case 20, so that the attachment body 14 is fixed to the box body 12, and the assembly is completed. A connector attachment portion 100 is provided in a side face of the attachment body 14, and connectors (not shown) are connected to the connector attachment portion 100 and the lateral connection type connectors 54a to 54c in the box body 12.

The projections 28 on the lower face 27 of the upper case 20 coaxially engage the recesses 52 in the upper ends of the bolt holes 50 of the main body-side connector 40. Thus, the main body-side connector 40 is positioned directly with respect to the upper case 20. Additionally, the attachment body-side connector 84 of the attachment body 14 is positioned directly with respect to the supports 30 of the upper case 20 at the rotating portions 88. Therefore, the main body-side connector 40 and the attachment body-side connector 84 are positioned directly with respect to the upper case 20. Thus, the main body-side connector 40 is positioned accurately on the upper case 20, and the attachment body 14 on the upper case 20 is aligned accurately with the main body-side connector 40. Consequently, the attachment body-side connector 84 in the attachment body 14 and the main body-side connector 40 are connected easily and reliably.

The accuracy of connection between the attachment body-side connector 84 and the main body-side connector 40 is improved without providing special processing, such as a guide groove and a guide pin on outer faces of the box body 12 and the attachment body 14 as in conventional structures. Moreover, assembly efficiency is improved since a worker need not insert a guide pin into a guide groove.

The main body-side connector 40 has an elongated shape and is positioned with respect to the upper case 20 at both end portions in the longitudinal direction. Thus, the main body-side connector 40 is positioned stably and accurately. Additionally, the projection-recess fitting positions the main body-side connector 40 with respect to the case by a simple structure and an easy assembly operation.

Upper ends of the bolt fixing portions 48 of the main body-side connector 40 have the recesses 52, and the positioning portion is formed by projection-recess fitting with the projections 28 on the lower face 27 of the upper case 20. Thus, the positioning portion does not require an excessive increase in the size of the main body-side connector 40.

Although an embodiment of the invention has been described above, the invention is not limited to the specific descriptions of this embodiment. For example, any positioning portion that directly positions the main body-side connector 40 with respect to the upper case 20 or the lower case 22 of the box body 12 can be used as the positioning portion of the invention, and in addition to the projection-recess fitting between the recesses 52 and the projections 28, which have been described in the above embodiment, known structures such as engagement by insertion of a projection into a through hole can also be adopted. When the box body 12 has plural cases like the upper case 20 and the lower case 22, it is desirable that the main body-side connector 40 is positioned with respect to the same case as the case on which the attachment body 14 is positioned.

A tubular portion may extend down from a peripheral edge of the opening hole 26, and may be slightly larger than the housing 44 of the main body-side connector 40 to define a positioning portion by projection-recess fitting between the tubular portion and the housing 44. Alternatively, the tubular portion may have plural independent projecting pieces with engagement projections in leading ends of the projecting pieces, and accommodation recesses may be at respective positions of the housing 44 in which the engagement projections are accommodated, thereby realizing a positioning portion that achieves positioning by the engagement.

The projections 28 and the recesses 52 that define the positioning portion, are at positions parallel to the longitudinal direction of the main body-side connector 40. However, the invention is not limited to parallel positions, and more than two projections 28 and more than two recesses 52 may be provided.

A structure in which a guide pin is provided in the vicinity of the main body-side connector 40 and inserted into a guide groove in the box body 12, as in a conventional structure can be adopted simultaneously in addition to the positioning portion of the invention. This can further improve the positioning accuracy between the main body-side connector 40 and the attachment body-side connector 84.

What is claimed is:

1. An electrical junction box, comprising:
   a box body with an upper case having an attachment surface and a lower surface opposite the attachment surface, an opening hole penetrating between the attachment surface and the lower surface, a support at an end of the box body opposite the opening hole, and first and second projections projecting down from the lower surface of the upper case on opposite longitudinal ends of the opening hole;
   a circuit board accommodated in the box body, a main body-side connector provided on the circuit board and protruding through the opening hole and above the attachment surface of the box body, first and second bolt fixing portions formed on opposite longitudinal ends of the main body-side connector and bolt holes formed through the respective bolt fixing portions, bolts passed through the circuit board and screwed respectively into lower ends of the bolt holes, the first and second projections being fit coaxially into upper ends of the respective bolt holes to position the main body-side connector with respect to the circuit board and the box body;
   and
   an attachment body connectable with the box body and having opposite first and second ends, a rotating portion provided at the first end of the attachment body and being supported on the support of the box body, an attachment body-side connector at the second end of the attachment body, the attachment body-side connector being connected to the main body-side connector by rotating the attachment body on the rotating portion while the rotating portion is supported by the support.

2. The electrical junction box of claim 1, wherein the main body-side connector has an elongated shape extending parallel to an axis of rotation of the attachment body.

3. The electrical junction box of claim 1, wherein the rotating portion comprises two rotating portions axially aligned with one another.

4. The electrical junction box of claim 1, further comprising a lock at an end of the attachment body opposite the rotating portion and a mating lock on the box body.

5. The electrical junction box of claim 1, wherein the box body further comprises a lower case secured to the upper case so that the upper and lower cases substantially surround the circuit board.

* * * * *